United States Patent
Kim

(10) Patent No.: US 8,178,381 B2
(45) Date of Patent: May 15, 2012

(54) BACK SIDE ILLUMINATION IMAGE SENSOR AND METHOD FOR MANUFACTURING THE SAME

(75) Inventor: Mun Hwan Kim, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 176 days.

(21) Appl. No.: 12/640,954

(22) Filed: Dec. 17, 2009

(65) Prior Publication Data

US 2010/0164036 A1 Jul. 1, 2010

(30) Foreign Application Priority Data

Dec. 26, 2008 (KR) .................. 10-2008-0134602

(51) Int. Cl.
*H01L 21/00* (2006.01)
(52) U.S. Cl. .................. 438/59; 257/70; 257/E21.001

(58) Field of Classification Search ............ 438/59, 438/65, 70, 207, 238; 257/E21.001
See application file for complete search history.

(56) References Cited

U.S. PATENT DOCUMENTS 7,582,502 B1 * 9/2009 Hwang et al. ........... 438/59

* cited by examiner

*Primary Examiner* — Hoai V Pham
(74) *Attorney, Agent, or Firm* — Saliwanchik, Lloyd & Eisenschenk

(57) ABSTRACT

Disclosed are a back side illumination image sensor and a method for manufacturing the same. The back side illumination image sensor includes an isolation region and a pixel area on a front side of a first substrate; a photo detector and a readout circuitry on the pixel area; an interlayer dielectric layer and a metal line on the front side of the first substrate; a second substrate bonded to the front side of the first substrate formed with the metal line; a pixel division ion implantation layer on the isolation region at a back side of the first substrate; and a micro-lens on the photo detector at the back side of the first substrate.

12 Claims, 6 Drawing Sheets

BACK SIDE ILLUMINATION IMAGE SENSOR AND METHOD FOR MANUFACTURING THE SAME

CROSS-REFERENCE TO RELATED APPLICATION

This application claims the benefit under 35 U.S.C. §119 of Korean Patent Application No. 10-2008-0134602, filed Dec. 26, 2008, which is hereby incorporated by reference in its entirety.

BACKGROUND

The present disclosure relates to a back side illumination image sensor.

Image sensors are semiconductor devices that convert an optical image into an electrical signal, and are mainly classified as a charge coupled device (CCD) or a CMOS image sensor (CIS).

According to a related art CIS, photodiodes are formed on a substrate through an ion implantation scheme. However, as the size of the photodiode has been gradually reduced to increase the number of pixels without enlarging the chip size, an area of a light receiving section is scaled down so that the image quality is degraded.

In addition, since a stack height is not sufficiently decreased corresponding to the area reduction of the light receiving section, the number of photons input into the light receiving section may be decreased due to the diffraction of light called "Airy Disk".

In order to solve the above problem, there is provided a back side illumination image sensor, which receives light through a wafer back side to minimize step difference at an upper portion of a light receiving section and avoid light interference caused by metal routing.

FIG. 1 is a cross-sectional view showing the procedure for forming a back side illumination image sensor according to the related art.

According to the back side illumination image sensor of the related art, a light receiving device and metal lines are formed on a front side of a substrate and then the substrate is subject to a back grinding process such that a back side of the substrate can be removed by a predetermined thickness. That is, the back side of the substrate is ground by a predetermined thickness in order to adjust the distance between an external module and an optical lens.

However, according to the back side illumination image sensor of the related art, an SOI (silicon on insulator) wafer is used as the donor wafer having the light receiving device and the circuit section, and then the SOI wafer is bonded to a handle wafer. Then, a back side thinning process is performed with respect to the donor wafer.

The back side thinning process for the donor wafer according to the related art is as follows.

First, a back side grinding process is performed with respect to the donor wafer such that a silicon layer having thickness of several tens of μm may remain on a buried oxide (BOX) layer of the SOI wafer. Then, an etch back process is performed, thereby completing the back side thinning process.

However, according to the related art, the expensive SOI wafer is used as the donor wafer, so the manufacturing cost may be increased.

In addition, according to the related art, as shown in FIG. 1, wafer edge thinning may occur when the back side grinding process is performed with respect to the donor wafer. Thus, when the subsequent etch back process is performed, chip failure may occur at a wafer edge part, so the economical efficiency is significantly lowered.

Further, according to the related art, a wafer center part is exposed to plasma damage when the etch back process is performed with respect to the wafer having thickness of several tens of μm, thereby degrading sensor performance.

In addition, according to the related art, an isolation region is formed only on the back side of the substrate formed with the photodiode, so that cross talk may occur.

Meanwhile, according to another related art, a photodiode may be deposited by using amorphous silicon (Si). Otherwise, after a readout circuitry is formed on a Si-substrate and the photodiode is formed on another wafer, the photodiode is formed over the readout circuitry through a wafer-to-wafer bonding scheme to form an image sensor (hereinafter, referred to as "3D image sensor"). In this case, the photodiode is connected with the readout circuitry through a metal line.

However, according to the related art for manufacturing the 3D image sensor, the wafer-to-wafer bonding must be performed with respect to the wafer having the readout circuitry and the wafer having the photodiode. Due to the wafer-to-wafer bonding, electric connection between the readout circuitry and the photodiode may not be ensured. For instance, according to the related art, the metal line is formed on the readout circuitry and then the wafer-to-wafer bonding is performed to allow the metal line to make contact with the photodiode. At this time, the metal line may not firmly come into contact with the photodiode and there is difficulty in formation of an ohmic contact between the metal line and the photodiode. In addition, according to the related art, a short may occur in the metal line electrically connected to the photodiode. Various studies and research have been conducted to prevent such a short, but complicated processes are required.

BRIEF SUMMARY

Embodiments provide a back side illumination image sensor and a method for manufacturing the same, capable of stably and efficiently removing a back side of a substrate for a back side illumination image sensor.

In addition, an embodiment provides a back side illumination image sensor and a method for manufacturing the same, capable of inhibiting cross talk.

An embodiment also provides a back side illumination image sensor and a method for manufacturing the same, capable of significantly reducing the manufacturing cost.

In addition, an embodiment provides a back side illumination image sensor and a method for manufacturing the same, capable of maximizing the quantity of incident light by minimizing a stack on a light receiving section while forming a photo detector and a readout circuitry on the same substrate and inhibiting light interference and light reflection caused by metal routing.

According to one embodiment, there is provided a back side illumination image sensor including: an isolation region and a pixel area on a front side of a first substrate; a photo detector and a readout circuitry on the pixel area; an interlayer dielectric layer and a metal line on the front side of the first substrate; a second substrate bonded to the front side of the first substrate formed with the metal line; a pixel division ion implantation layer on the isolation region at a back side of the first substrate; and a micro-lens on the photo detector at the back side of the first substrate.

According to an embodiment, there is provided a method for manufacturing a back side illumination image sensor, the method including: forming an ion implantation layer by implanting ions over a whole area of a front side of a first substrate; defining a pixel area by forming an isolation region on the front side of the first substrate formed with the ion implantation layer; forming a photo detector and a readout circuitry on the pixel area; forming an interlayer dielectric layer and a metal line on the front side of the first substrate; bonding a second substrate to the front side of the first substrate formed with the metal line; removing a lower portion of the first substrate defined by the ion implantation layer; forming a pixel division ion implantation layer on the isolation region at a back side of the first substrate; and forming a micro-lens on the photo detector at the back side of the first substrate.

According to another embodiment, there is provided a method for manufacturing a back side illumination image sensor, the method including: defining a pixel area by forming an isolation region on a front side of a first substrate; forming an ion implantation layer by implanting ions over a whole area of the front side of the first substrate; forming a photo detector and a readout circuitry on the pixel area; forming an interlayer dielectric layer and a metal line on the front side of the first substrate; bonding a second substrate to the front side of the first substrate formed with the metal line; removing a lower portion of the first substrate defined by the ion implantation layer; forming a pixel division ion implantation layer on the isolation region at a back side of the first substrate; and forming a micro-lens on the photo detector at the back side of the first substrate.

DETAILED DESCRIPTION

Hereinafter, embodiments of a back side illumination image sensor and a method for manufacturing the same will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
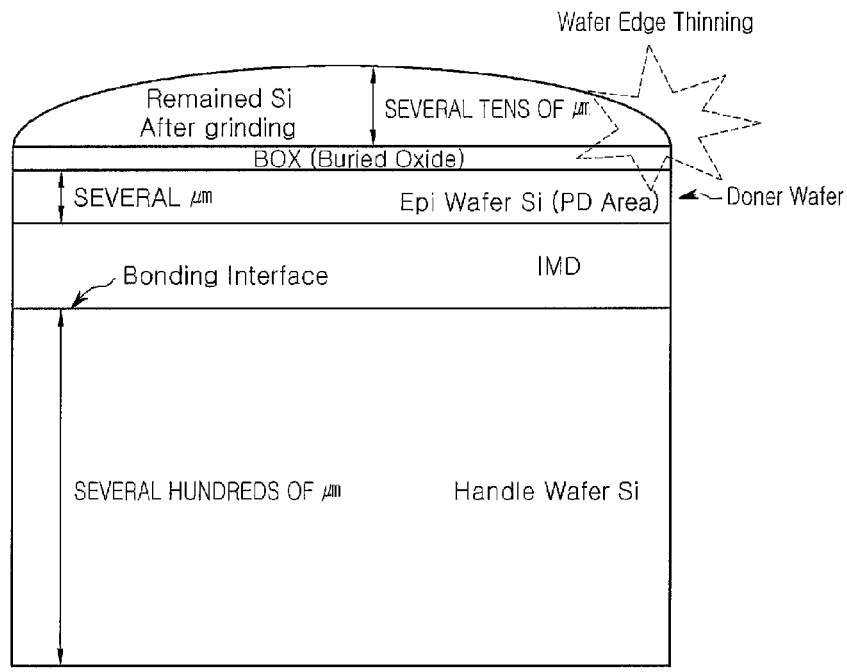
FIG. 1 is a cross-sectional view showing a procedure for forming a back side illumination image sensor according to the related art.
Figure 2:
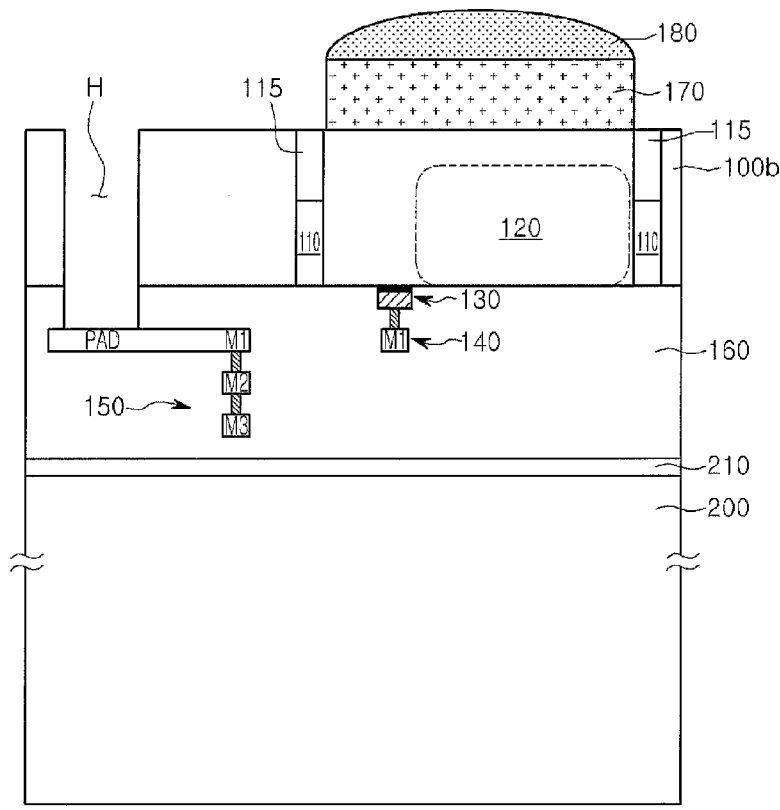
FIG. 2 is a cross-sectional view showing a back side illumination image sensor according to an embodiment.

FIG. 2 is a cross-sectional view showing the back side illumination image sensor according to one embodiment.

The back side illumination image sensor according to an embodiment includes an isolation region 110 and a pixel area on a front side of a first substrate 100; a photo detector 120 and a readout circuitry 130 on the pixel area; an interlayer dielectric layer 160 and a metal line 140 on the front side of the first substrate 100; a second substrate 200 bonded to the front side of the first substrate 100 formed with the metal line 140; a pixel division ion implantation layer 115 on the isolation region 110 at a back side of the first substrate 100; and a micro-lens 180 on the photo detector 120 at the back side of the first substrate 100.

According to the back side illumination image sensor and method for manufacturing the same of an embodiment, a back side of a substrate can be stably and efficiently removed through an ion implantation scheme. That is, the embodiment employs ion implantation and cleaving schemes without performing a back grinding and etch back process, so edge die fail and plasma damage may not occur.

In addition, according to an embodiment, a pixel division ion implantation layer is formed at the back side of the substrate on a pixel division insulating layer that serves as an isolation region (110), so cross talk between pixels can be effectively inhibited, thereby improving image quality.

Hereinafter, a method for manufacturing the back side illumination image sensor according to an embodiment will be described with reference to FIGS. 3 to 8.

Figure 3A:
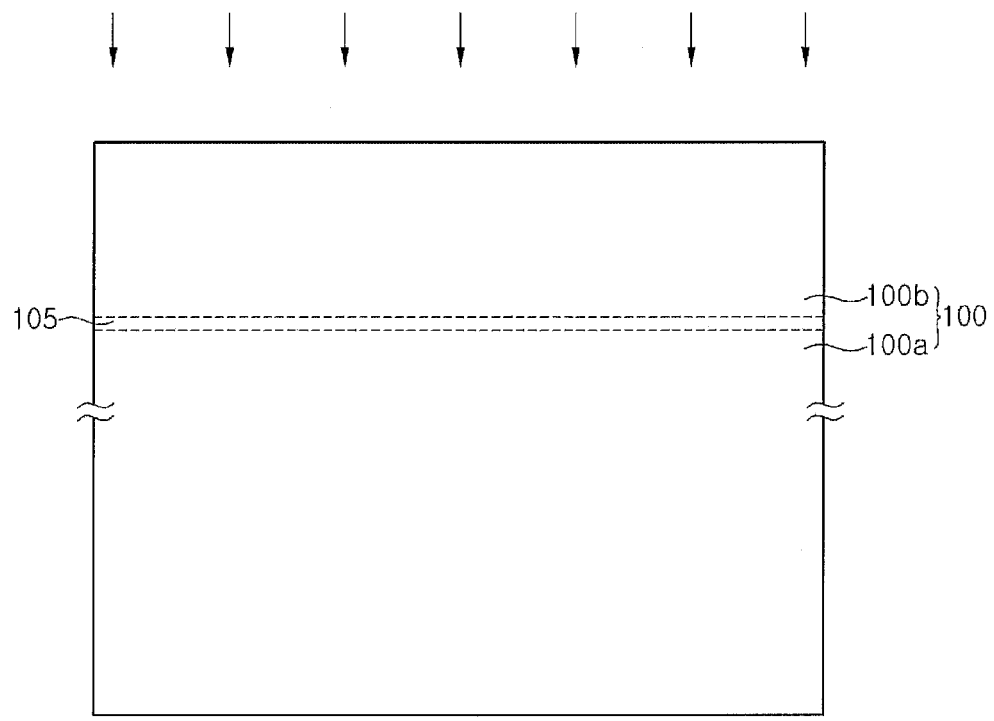
FIGS. 3 to 8 are cross-sectional views showing a method for manufacturing a back side illumination image sensor according to an embodiment.
Figure 3B:
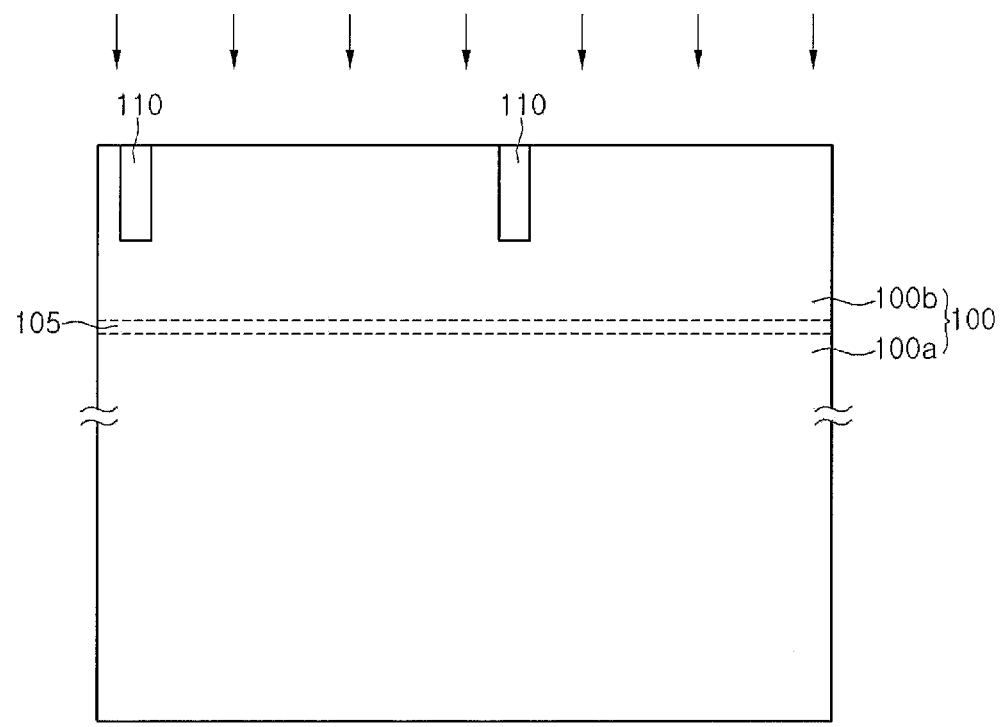
Figure 3C:
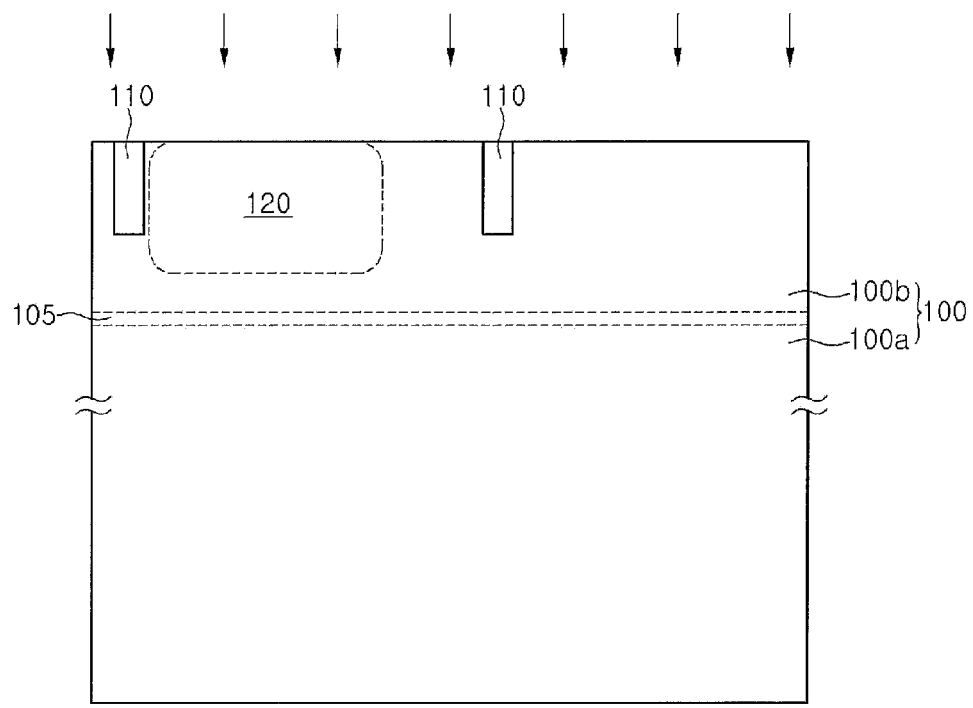

FIGS. 3A to 3C are views showing examples for forming an ion implantation layer 105.

First, as shown in FIG. 3A, the ion implantation layer 105 is formed on a front side of a first substrate 100. The first substrate 100 may be an epitaxial wafer, but the embodiment is not limited thereto. The first substrate 100 is divided into a lower portion 100a and an upper portion 100b by the ion implantation layer 105.

According to the method for manufacturing the back side illumination image sensor of the embodiment, an epitaxial wafer is employed as a donor wafer (first substrate 100). Since embodiments use the epitaxial wafer instead of an SOI wafer, the manufacturing cost can be significantly reduced.

In addition, according to an embodiment, the epitaxial wafer is used as the donor wafer and a photo detector is formed on the epitaxial wafer together with a circuit section, so the bonding process is not required as in the 3D image sensor where the photodiode is provided above a circuit and metal interconnection. Therefore, a 3D image sensor can be easily manufactured without causing problems related to the bonding and contact.

The ion implantation layer 105 can be formed by implanting ions into the front side of the first substrate 100. Since the back side of the first substrate 100 has thickness of several hundreds of μm or above, it is preferred to implant ions through the front side of the first substrate 100.

That is, since the thickness of the first substrate 100 is larger than the ion implantation depth, it can be difficult to implant the ions through the back side of the first substrate 100. Therefore, according to an embodiment, the ion implantation layer 105 is aimed in the first substrate 100 before the metal line 140 is formed or the bonding process is performed with respect to the second substrate 200, so that the lower portion 100a of the first substrate 100 can be easily removed after the bonding process.

According to an embodiment, the ion implantation layer 105 is formed by implanting ions, such as hydrogen (H) or helium (He), but the embodiment is not limited thereto.

In addition, according to another embodiment, as shown in FIG. 3B, the ion implantation 105 can be formed after the isolation region 110 has been formed on the front side of the first substrate 100. For instance, the isolation region 110 is formed on the front side of the first substrate 100 to define a pixel area and then the ion implantation layer 105 is formed. At this time, the isolation region 110 can be formed through the STI process.

According to embodiments, the back side of the substrate is easily and stably removed by using the ion implantation layer 105 without performing the grinding process, so that the product yield can be significantly improved.

In addition, according to an embodiment, the ion implantation process is performed by using hydrogen or helium to form the ion implantation layer 105 serving as a cleaving layer while the manufacturing process is being performed with respect to the epitaxial wafer. Then, the first substrate 100 serving as the donor wafer is bonded to the second substrate 200 serving as the handle wafer after the process for the first substrate 100 has been completed. Then, the cleaving process is performed with respect to the first substrate serving as the donor wafer for the purpose of back side thinning. In this case, since the first substrate 100 serving as a donor wafer is thin because the lower portion of the first substrate 100 has been removed, the second substrate 200 serving as a handle wafer is used in order to facilitate a color filter process after the bonding process has been performed.

According to embodiments, the ion implantation and cleaving processes are employed without performing the back grinding and etch back processes, so the problems occurring in the related art, such as edge die fail and plasma damage, may not occur.

In addition, according to an embodiment, the donor wafer is not subject to the grinding process, so physical stress may not be applied to the donor wafer, so that the photo detector and the readout circuitry can be inhibited from being damaged.

According to yet another embodiment, as shown in FIG. 3C, the ion implantation layer 105 can be formed after the photo detector 120 has been formed in the pixel area. The photo detector 120 may include a photodiode, but the embodiment is not limited thereto. The photo detector 120 can be obtained by forming an N type ion implantation area in a P type first substrate 100 and then forming a Po area (not shown) in the N type ion implantation area of the first substrate 100, but the embodiment is not limited thereto. Extra electrons may not be generated due to the Po area. In addition, according to an embodiment, the PNP junction is formed to achieve the charge dumping effect.

Figure 4:
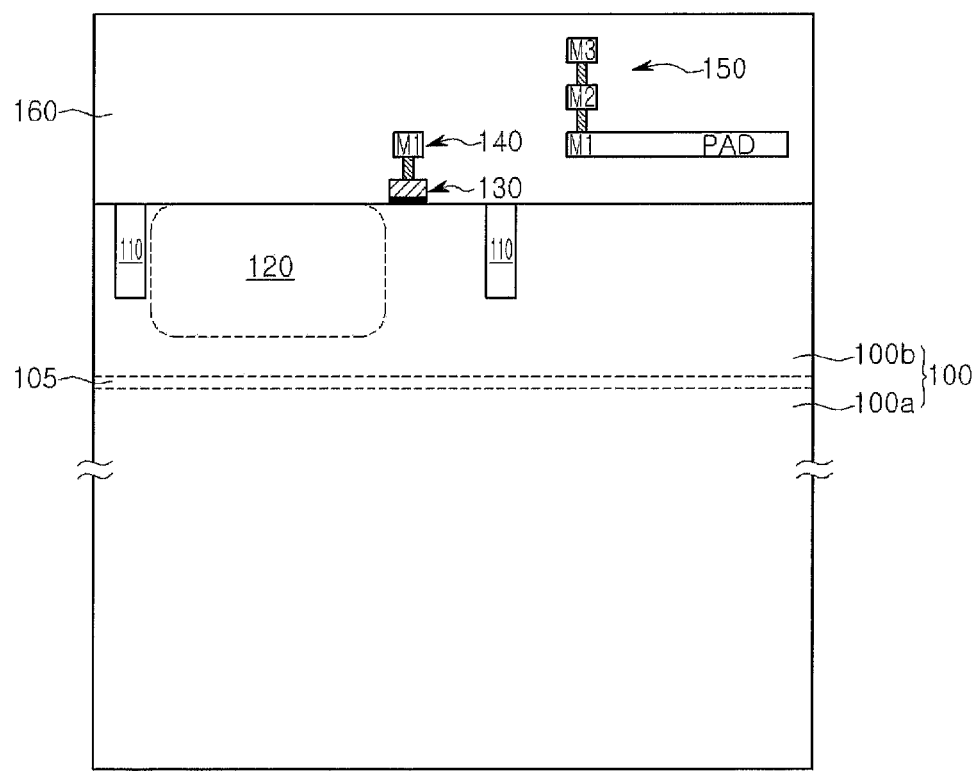

Referring to FIG. 4, after forming the ion implantation layer 105 and the photo detector 120, the readout circuitry 130 serving as a circuit section is formed on the first substrate 100 having the photo detector 120. The readout circuitry 130 may include a transfer transistor, a reset transistor, a drive transistor, and a select transistor, but the embodiment is not limited thereto.

According to an embodiment, the first substrate 100 serving as the donor wafer may be an epitaxial wafer, and the photo detector 120 is formed on the first substrate 100 together with the readout circuitry 130. Therefore, the bonding process is not required as in the 3D image sensor where the photo detector is formed over the circuit, so that the manufacturing process can be simplified and the problems related to the bonding and contact may not occur. Meanwhile, an insulating layer, such as an interlayer dielectric layer, is interposed between the handle wafer and the donor wafer when the handle wafer is bonded to the donor wafer, so the problems related to the bonding may not occur.

In addition, according to an embodiment, the quantity of incident light can be maximized by minimizing a stack on a light receiving section and light interference and light reflection caused by metal routing can be inhibited, so that the optical characteristics of the image sensor can be optimized.

Next, referring again to FIG. 4, an interlayer dielectric layer 160, a metal line 140, and a pad metal line are formed on the first substrate 100. The metal line 140 may include a first metal M1, a second metal M2, etc.

The pad metal line 150 is formed in a logic area. The pad metal line 150 may include a first metal M1, a second metal M2, a third metal M3, etc., but the embodiment is not limited thereto. A pad can be aligned in line with the first metal M1 of the metal line 140. Thus, a pad opening process can be easily performed through the back side of the first substrate 100 after the first substrate 100 has been bonded to the second substrate 200. This is because a depth from the back side of the first substrate 100 to the pad is shallow.

Figure 5:
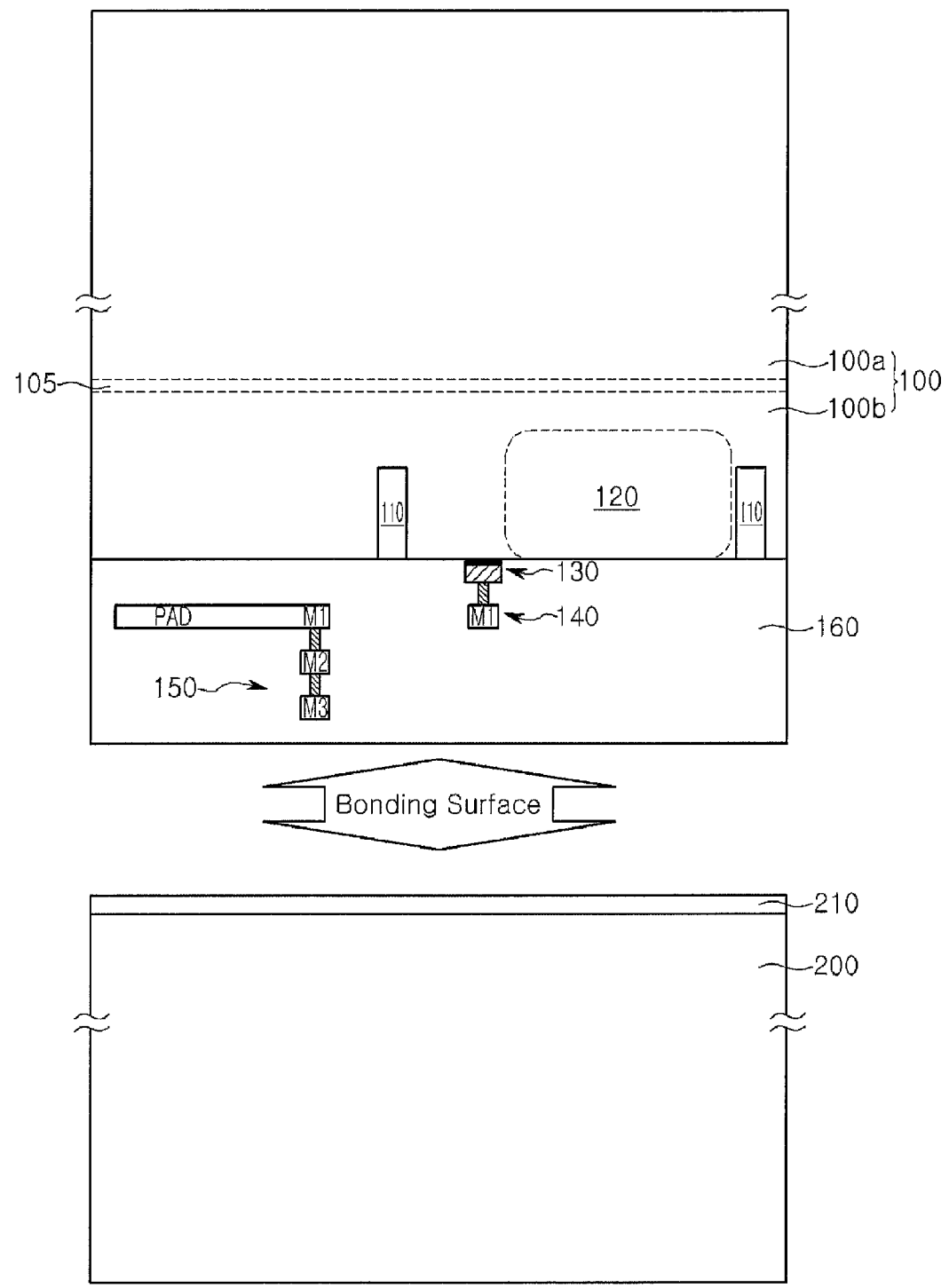

Then, as shown in FIG. 5, the second substrate 200 is bonded to the front side of the first substrate 100 having the metal line 140. For instance, the second substrate 200 serving as the handle wafer is bonded to the first substrate 100 while facing the metal line 140.

According to an embodiment, an insulating layer 210 is formed on the top surface of the second substrate 200 and bonded to the first substrate, thereby enhancing bonding force between the first and second substrates 100 and 200. The insulating layer 210 may include an oxide layer or a nitride layer, but the embodiment is not limited thereto. Since the insulting layer 210 is bonded to the first substrate 100 while making contact with the interlayer dielectric layer 160 serving as the front side of the first substrate 100, the bonding force between the first and second substrates 100 and 200 can be significantly enhanced.

Figure 6:
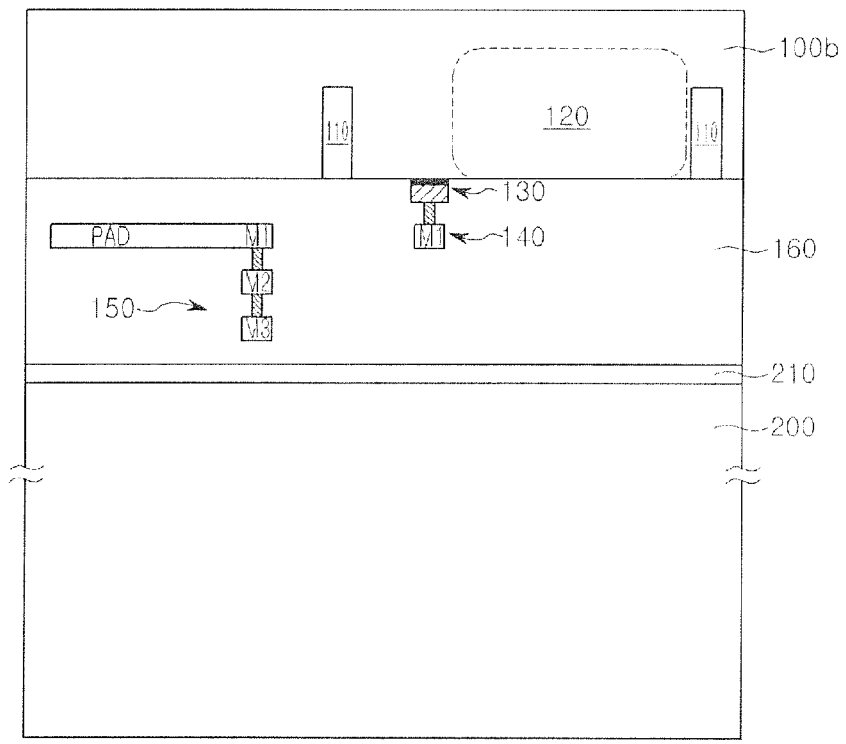

Thereafter, as shown in FIG. 6, the lower portion 100a of the first substrate 100 is removed from the first substrate 100 bonded to the second substrate 200 as shown in FIG. 5. At this time, the ion implantation layer 105 serves as a reference line for removing the lower portion 100a of the first substrate 100. For instance, the ion implantation layer 105 is subject to the heat treatment process to make hydrogen ions into bubbles, and then the lower portion 100a of the first substrate 100 is cut away by a blade, so that only the upper portion 100b of the first substrate 100 remains. After that, a planarization process is performed with respect to the cutting surface of the first substrate 100.

Meanwhile, in the patents related to the 3D image sensors employing the cleaving technique, the photo detector and the readout circuitry are formed on their own wafers, respectively, and then the bonding and interconnection processes are performed. According to the related art, the ion implantation process to form the cleaving layer is often performed by using hydrogen ions or helium ions just before the bonding.

However, according to the 3D image sensor of the related art, electric connection between the readout circuitry and the photodiode may not be ensured, and shorts may occur in the metal line electrically connected to the photodiode.

In contrast, according to embodiments of the present invention, an epitaxial wafer can be used as the first substrate 100 serving as the donor wafer, and the photo detector 120 can be formed on the first substrate 100 together with the readout circuitry 130. Therefore, the bonding process for bonding the substrate having the photo detector to the substrate having the circuit is not used. Accordingly, an image sensor can be easily manufactured without causing problems related to the bonding and contact.

Meanwhile, according to the 3D image sensor of the related art, hydrogen ions or helium ions can be implanted just before the bonding process. That is, electrons generated from the photo detector are transferred to an electronic circuit section formed on a separate substrate, so that the voltage is changed. Thus, according to the related art, it is not necessary to form a metal line and interlayer dielectric layer on the substrate where the photodiode is formed, enabling the hydrogen ions or helium ions to be implanted just before the bonding process.

In contrast, according to embodiments, the photo detector 120 is formed on the first substrate 100 together with the readout circuitry 130. That is, since the photo detector 120 and the readout circuitry 130 are formed on the first substrate 100, the BEOL (back end of line) process is performed with respect to the donor wafer (first substrate 100) to form the metal line 140 and the interlayer dielectric layer 160.

Therefore, according to the process scheme of the embodiment, the ion implantation process using hydrogen ions or helium ions is not performed just before the bonding process. Rather, the ion implantation process is performed using hydrogen ions or helium ions before the metal line 140 and the interlayer dielectric layer 160 have been formed on the epitaxial wafer serving as the first substrate 100.

Figure 7:
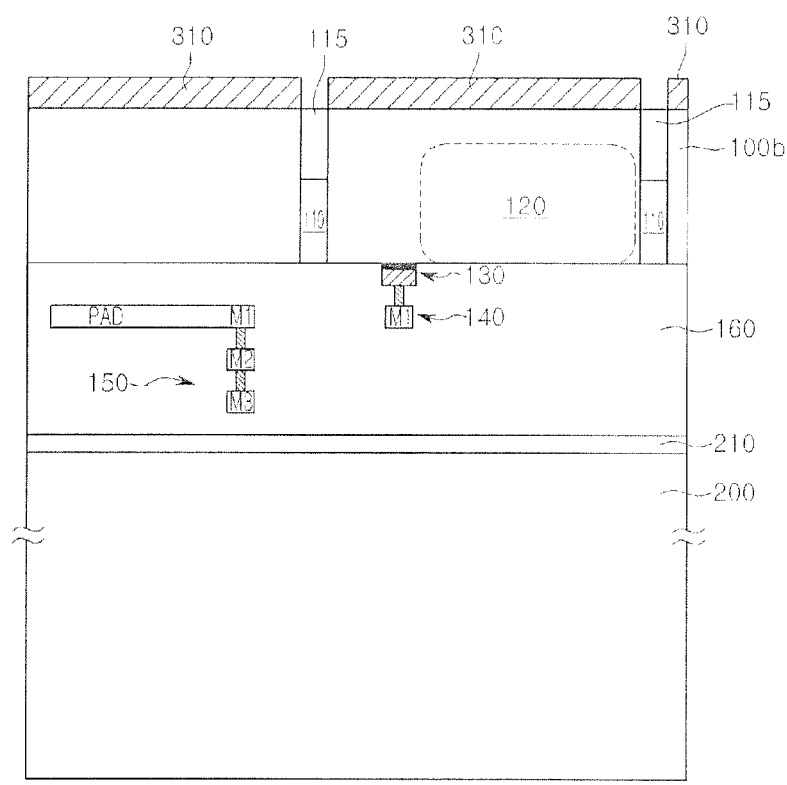

Referring to FIG. 7, a pixel division ion implantation layer 115 is formed on the isolation region 110 at the back side of the first substrate. For instance, after preparing a mask pattern 310 that exposes the back side of the first substrate at the upper portion of the isolation region 110, an ion implantation process is performed by using the mask pattern 310 as an ion implantation mask, thereby forming the pixel division ion implantation layer 115. For instance, the pixel division ion implantation layer 115 may include a heavily doped P type ion implantation area.

According to an embodiment, since the pixel division ion implantation layer is formed above the pixel division insulating layer (isolation region) at the back side of the substrate, cross talk between the pixels can be effectively inhibited, so that the image quality can be improved.

Figure 8:
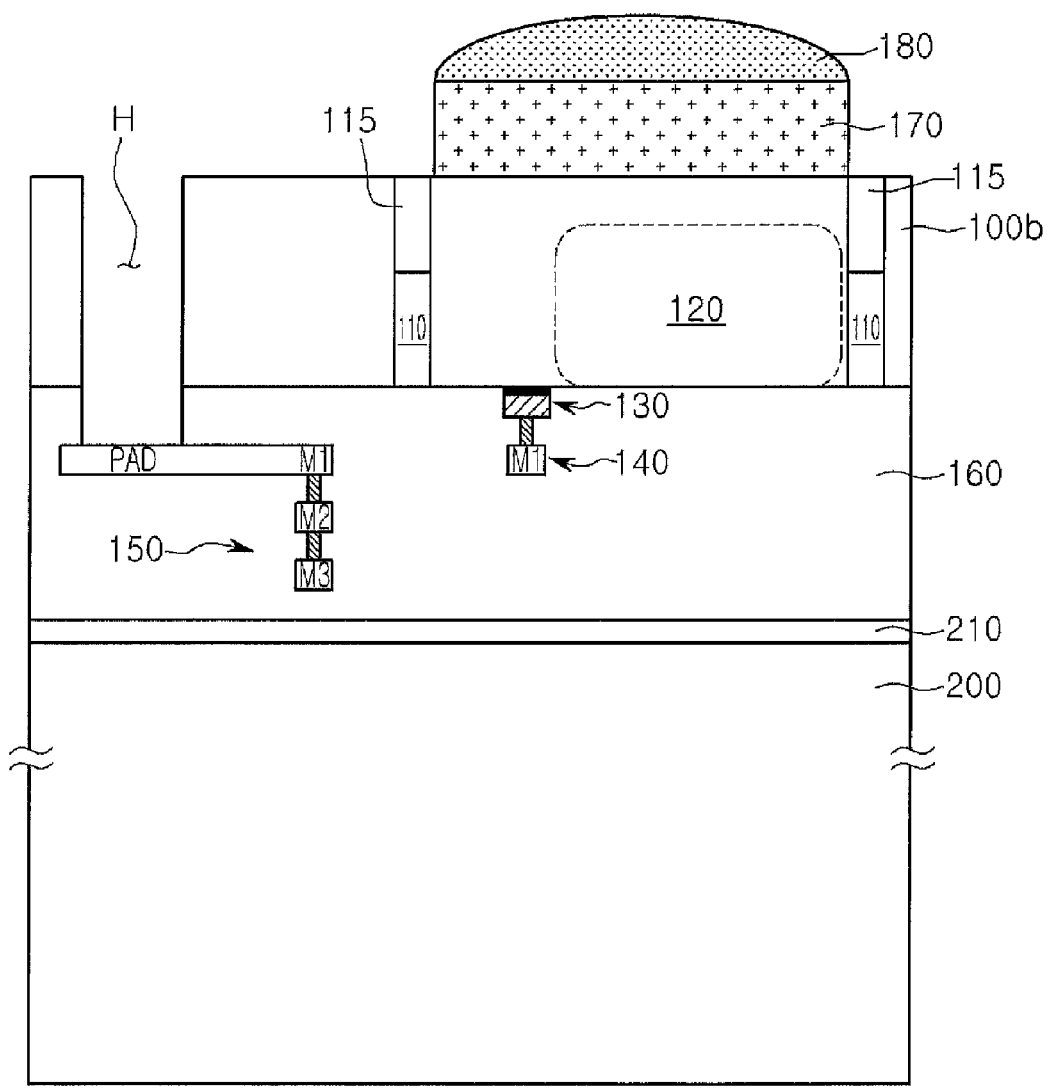

Then, as shown in FIG. 8, the mask pattern 310 is removed and a color filter 170 is formed on the photo detector 120 at the back side of the first substrate 100. Meanwhile, for embodiments such as where the photo detector 120 includes vertically stacked R, G, and B photodiodes, the color filter 170 can be omitted.

After that, a micro-lens 180 is formed on the color filter 170.

Then, the pad is opened. According to an embodiment, the pad is opened through the back side of the first substrate 100. Since the pad is aligned in line with the first metal M1, the pad can be easily open through the back side of the first substrate 100.

According to the back side illumination image sensor and the method for manufacturing the same of embodiments, the back side of the substrate can be stably and efficiently removed through an ion implantation scheme. That is, ion implantation and cleaving schemes are employed without performing the back grinding and etch back processes, so edge die fail and plasma damage may not occur.

In addition, according to an embodiment, the pixel division ion implantation layer is formed on the pixel division insulating layer (isolation region) at the back side of the substrate, so that cross talk between the pixels can be effectively inhibited, thereby improving the image quality.

Further, according to an embodiment, the donor wafer is not subject to the grinding process, so the photo detector and the circuit section can be inhibited from being damaged.

In addition, according to an embodiment, the epitaxial wafer is employed as the donor wafer, and the photo detector is formed on the epitaxial wafer together with a circuit section. Because the epitaxial wafer is employed instead of the SOI wafer, the manufacturing cost can be significantly reduced.

According to an embodiment, the epitaxial wafer can be used as the donor wafer and the photo detector is formed on the epitaxial wafer together with the circuit section, so that the bonding process is not required as in the 3D image sensor where the photo detector is formed over the circuit. Accordingly, the manufacturing process can be simplified and the problems related to the bonding and contact may not occur. Meanwhile, an insulating layer, such as an interlayer dielectric layer, is interposed between the handle wafer and the donor wafer when the handle wafer is bonded to the donor wafer, so the problems related to the bonding may not occur.

In addition, according to an embodiment, the quantity of incident light can be maximized by minimizing a stack on a light receiving section and light interference and light reflection caused by metal routing can be inhibited, so that the optical characteristics of the image sensor can be optimized.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a back side illumination image sensor, the method comprising:
    forming an ion implantation layer by implanting ions over a whole area of a front side of a first substrate;
    defining a pixel area by forming an isolation region on the front side of the first substrate;
    forming a photo detector and a readout circuitry on the pixel area;
    forming an interlayer dielectric layer and a metal line on the front side of the first substrate;
    bonding a second substrate to the front side of the first substrate formed with the metal line;
    removing a lower portion of the first substrate defined by the ion implantation layer;
    forming a pixel division ion implantation layer on the isolation region at a back side of the first substrate after removing the lower portion of the first substrate; and
    forming a micro-lens on the photo detector at the back side of the first substrate.

2. The method of claim 1, wherein the forming of the pixel division ion implantation layer includes implanting ions into the back side of the first substrate such that the pixel division ion implantation layer ranges from the surface of the back side of the first substrate to the isolation region.

3. The method of claim 1, wherein the forming of the pixel division ion implantation layer includes forming a P type ion implantation area on the isolation region.

4. The method of claim 1, wherein the forming of the ion implantation layer includes implanting hydrogen ions or helium ions.

5. The method of claim 1, wherein the forming of the ion implantation layer implants the ions through the front side of the first substrate such that the ion implantation layer is formed over the whole area in the front side of the first substrate at a predetermined depth.

6. The method of claim 1, wherein the removing of the lower portion of the first substrate includes removing a portion of the first substrate at a side of the first substrate opposite to the front side of the first substrate by using the ion implantation layer.

7. The method of claim 1, further comprising opening a pad formed on the front side of the first substrate after the lower portion of the first substrate has been removed.

8. The method of claim 7, wherein the pad is open through the back side of the first substrate.

9. The method of claim 1, further comprising forming an insulating layer on the second substrate before the second substrate is bonded to the front side of the first substrate, such that the insulating layer makes contact with the front side of the first substrate when the second substrate is bonded to the front side of the first substrate.

10. The method of claim 1, wherein the ion implantation layer is formed before the isolation region.

11. The method of claim 1, wherein the ion implantation layer is formed before forming the photo detector.

12. The method of claim 1, wherein the ion implantation layer is formed after forming the photo detector.

* * * * *